(12) United States Patent
Zhou et al.

(10) Patent No.: US 11,764,163 B2
(45) Date of Patent: Sep. 19, 2023

(54) SEMICONDUCTOR ENCAPSULATION STRUCTURE AND ENCAPSULATION METHOD

(71) Applicant: LUXSHARE ELECTRONIC TECHNOLOGY (KUNSHAN) LTD., Kunshan (CN)

(72) Inventors: Xiaolei Zhou, Kunshan (CN); Peng Liu, Kunshan (CN); Wenbin Kang, Kunshan (CN)

(73) Assignee: LUXSHARE ELECTRONIC TECHNOLOGY (KUNSHAN) LTD., Kunshan (CN)

( * ) Notice: Subject to any disclaimer, the term of this patent is extended or adjusted under 35 U.S.C. 154(b) by 160 days.

(21) Appl. No.: 17/380,329

(22) Filed: Jul. 20, 2021

(65) Prior Publication Data

US 2022/0102286 A1   Mar. 31, 2022

(30) Foreign Application Priority Data

Sep. 27, 2020   (CN) .......................... 202011029007.8

(51) Int. Cl.
*H01L 23/552*    (2006.01)
*H01L 23/522*    (2006.01)
*H01Q 1/22*      (2006.01)

(52) U.S. Cl.
CPC ........ *H01L 23/552* (2013.01); *H01L 23/5226* (2013.01); *H01Q 1/2208* (2013.01)

(58) Field of Classification Search
CPC .. H01L 23/552; H01L 23/5226; H01Q 1/2208
(Continued)

(56) References Cited

U.S. PATENT DOCUMENTS

2010/0276792 A1\*  11/2010  Chi ..................... H01L 23/3128
                                                257/E23.116
2019/0274212 A1    9/2019  Otsubo
(Continued)

FOREIGN PATENT DOCUMENTS

CN           1849052 A     10/2006
CN         202705026 U      1/2013
(Continued)

OTHER PUBLICATIONS

First Search Report for CN 202011029007.8 dated Nov. 13, 2020.
Office Action for CN 202011029007.8 dated Dec. 9, 2020.
Office Action for CN 202011029007.8 dated Nov. 20, 2020.

*Primary Examiner* — Tu-Tu V Ho
(74) *Attorney, Agent, or Firm* — Birch, Stewart, Kolasch & Birch, LLP

(57) ABSTRACT

Provided are a semiconductor encapsulation structure and an encapsulation method. The structure includes a circuit board, which includes at least one electromagnetic shield area and a non-electromagnetic shield area located on one side of the electromagnetic shield area, where the circuit board internally includes a number N of metal line layers stacked in sequence and insulating layers located between adjacent metal line layers; a non-shield module and a shield module, where the non-shield module is located within the non-electromagnetic shield area, and the shield module is located within the electromagnetic shield area; a thin film encapsulation layer, located on a side of the circuit board adjacent to the first surface, where the thin film encapsulation layer covers the non-electromagnetic shield area and the electromagnetic shield area; an electromagnetic shield structure, which covers the electromagnetic shield area and forms the closed space with the circuit board.

20 Claims, 7 Drawing Sheets

(58) Field of Classification Search
USPC .......................................................... 257/659
See application file for complete search history.

(56) References Cited

U.S. PATENT DOCUMENTS

2019/0310687 A1* 10/2019 Hong .................. H01L 23/3114
2020/0343196 A1* 10/2020 Tsai ..................... H01Q 1/2283

FOREIGN PATENT DOCUMENTS

| CN | 108074825 A | 5/2018 |
| --- | --- | --- |
| CN | 108962837 A | 12/2018 |
| CN | 110349937 A | 10/2019 |
| CN | 110875281 A | 3/2020 |
| CN | 110993508 A | 4/2020 |
| CN | 111128763 A | 5/2020 |
| CN | 111128901 A | 5/2020 |

* cited by examiner a second groove is formed on the thin film encapsulation layer within an electromagnetic shield area and a power supply ground line on the first surface of the circuit board is exposed out of the second groove, where a projection of a bottom of the second groove on the circuit board is located within a projection of the power supply ground line on the circuit board ~1401 a sacrificial layer is formed in the first groove, where a height of the sacrificial layer is equal to a depth of the first groove ~1402 a conductive filling shield wall is formed in the second groove ~1403 the thin film encapsulation layer and the circuit board are cut along a cutting street so as to form a single semiconductor encapsulation structure, where each semiconductor encapsulation structure includes at least one shield module and at least one non-shield module ~1404 an electromagnetic shield sputtered coating is formed on one surface of the thin film encapsulation layer facing away from the circuit board, another side face of the thin film encapsulation layer and one side face of the circuit board ~1405 the electromagnetic shield sputtered coating and the sacrificial layer within the non-electromagnetic shield area are removed ~1406

FIG. 13

SEMICONDUCTOR ENCAPSULATION STRUCTURE AND ENCAPSULATION METHOD

TECHNICAL FIELD

The present disclosure relates to the technical field of semiconductors, in particular, a semiconductor encapsulation structure and an encapsulation method.

BACKGROUND

In an electronic encapsulation process, along with a trend towards miniaturization of the encapsulation size, signal crosstalk is likely to occur when electronic devices in the semiconductor encapsulation structure are too close. Especially for high-frequency analog chips, the reliability of the high-frequency analog chip is easily interfered by external electromagnetic signals. Therefore, a corresponding electromagnetic shield structure needs to be provided for encapsulation of some electronic devices, and the electromagnetic shield structure can eliminate adverse effects of electromagnetic interference on the electronic devices.

The electromagnetic shield structure in the related art adopts a metal cover, causing the overall size of the semiconductor encapsulation structure to be too large, which is contradictory to the trend towards high integration and miniaturization of the semiconductor encapsulation structure.

SUMMARY

In view of the above, embodiments of the present disclosure provide a semiconductor encapsulation structure and an encapsulation method, which reduces the size of the semiconductor encapsulation structure and improves the integration level of the semiconductor encapsulation structure.

In a first aspect, embodiments of the present disclosure provide a semiconductor encapsulation structure, including: a circuit board, a non-shield module, a shield module, a thin film encapsulation layer, and an electromagnetic shield structure. The circuit board includes at least one electromagnetic shield area and a non-electromagnetic shield area located on one side of the electromagnetic shield area. The circuit board internally includes a number N of metal line layers stacked in sequence and insulating layers located between adjacent metal line layers, and the number N of metal line layers are electrically connected through conductive vias on the insulating layers. A first pad located within the non-electromagnetic shield area on a first surface of the circuit board, a second pad located within the at least one electromagnetic shield area on the first surface of the circuit board, and a power supply ground line on the first surface of the circuit board are electrically connected to the metal line layers. The number N of metal line layers include an antenna structure and a power supply ground line-signal line hybrid distribution line layer, and N is an integer greater or equal to 1. The non-shield module and the shield module are respectively located on the first surface of the circuit board. The non-shield module is located within the non-electromagnetic shield area, and the shield module is located within the electromagnetic shield area. A connection end of the non-shield module is electrically connected to the first pad through a conductive wire, and a connection end of the shield module is located on one surface of the second pad facing from the circuit board and is electrically connected to the second pad. The thin film encapsulation layer is located on a side of the circuit board adjacent to the first surface. The thin film encapsulation layer covers the non-electromagnetic shield area and the at least one electromagnetic shield area, and the electromagnetic shield structure covers the at least one electromagnetic shield area and forms a closed space with the circuit board.

In a second aspect, embodiments of the present disclosure provide an encapsulation method for a semiconductor structure. The method includes steps described below.

A circuit board is provided. The circuit board includes at least one electromagnetic shield area and a non-electromagnetic shield area located on one side of the at least one electromagnetic shield area. The circuit board internally includes a number N of metal line layers stacked in sequence and insulating layers located between adjacent metal line layers, and the number N of metal line layers are electrically connected through conductive vias on the insulating layers. A first pad located within the non-electromagnetic shield area on a first surface of the circuit board, a second pad located within the electromagnetic shield area on the first surface of the circuit board, and a power supply ground line on the first surface of the circuit board are electrically connected to the metal line layers. The number N of metal line layers include an antenna structure and a power supply ground line-signal line hybrid distribution line layer, and N is an integer greater or equal to 1.

A non-shield module and a shield module are formed on the first surface of the circuit board. The non-shield module is located within the non-electromagnetic shield area, and the shield module is located within the at least one electromagnetic shield area. A connection end of the non-shield module is electrically connected to the first pad through a conductive wire, and a connection end of the shield module is located on one surface of the second pad facing away from the circuit board and is electrically connected to the second pad.

A thin film encapsulation layer is formed on a side of the circuit board adjacent to the first surface, where the thin film encapsulation layer covers the non-electromagnetic shield area and the at least one electromagnetic shield area.

An electromagnetic shield structure is formed on one side of the shield module facing away from the circuit board, and the electromagnetic shield structure forms a closed space with the circuit board.

In the solution provided by this embodiment, the connection end of the shield module is located on the one surface of the second pad facing away from the circuit board, and the shield module is electrically connected to the connection end of the non-shield module through the second pad, the conductive vias, the metal line layers and the first pad. The electromagnetic shield structure covers the electromagnetic shield area, forms the closed space with the circuit board, and is used for shielding the interference of electromagnetic signals on the shield module. Since the thin film encapsulation layer within the non-electromagnetic shield area where the non-shield module is located is not provided with an electromagnetic shield structure, on the basis of not raising the height of the non-electromagnetic shield area where the non-shield module is located, the small-size electromagnetic shield structure reduces the size of the semiconductor encapsulation structure and further improves the integration level of the semiconductor encapsulation structure.

BRIEF DESCRIPTION OF DRAWINGS

FIG. 13 is a flowchart of another encapsulation method for a semiconductor structure according to an embodiment of the present disclosure.

DETAILED DESCRIPTION

Figure 1:
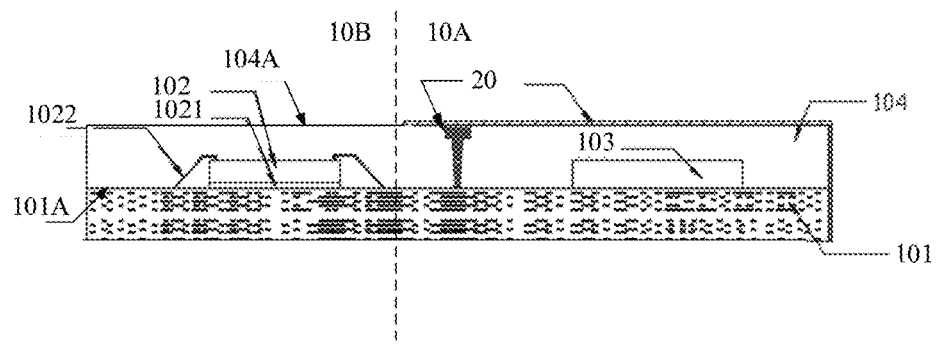
FIG. 1 is a sectional view of a semiconductor encapsulation structure provided by an embodiment of the present disclosure.

Hereinafter the present disclosure is further described in detail in conjunction with the drawings and embodiments. It is to be understood that the embodiments described below are merely intended to illustrate and not to limit the present disclosure. Additionally, it is to be noted that for ease of description, only part, not all, of the structures related to the present disclosure are illustrated in the drawings.

As described in the above background, for the semiconductor encapsulation structure in the related art, the structure size of the semiconductor encapsulation structure after the shield module is encapsulated is too big, which is contradictory to the trend towards high integration and miniaturization of the semiconductor. For the semiconductor encapsulation structure in the related art, a metal cap is usually adopted to cover the semiconductor encapsulation structure including the shield module, so as to shield the interference of electromagnetic signals. The metal cap is not formed together with the semiconductor encapsulation structure including the shield module, but is a metal cap having an accommodating encapsulation structure and formed by using a stamping forming or a casting process. The overall size of the metal cap is generally large, causing the overall size of the semiconductor encapsulation structure to be too large, which is contradictory to the trend towards high integration and miniaturization of the semiconductor encapsulation structure.

To solve the above technical problem, embodiments of the present disclosure provide a semiconductor encapsulation structure and an encapsulation method thereof.

Figure 2:
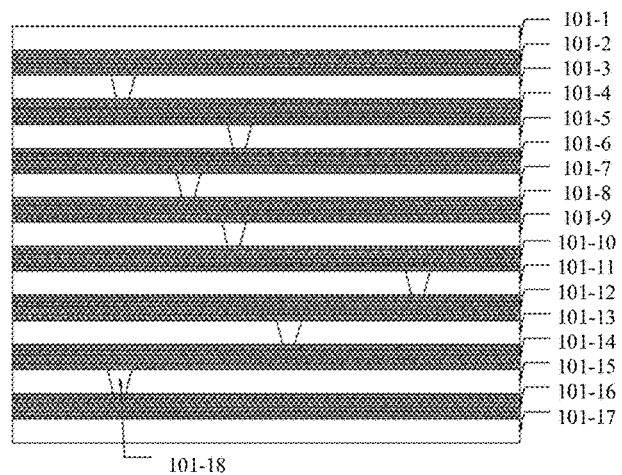
FIG. 2 is a sectional view of a circuit board provided by an embodiment of the present disclosure.
Figure 3:
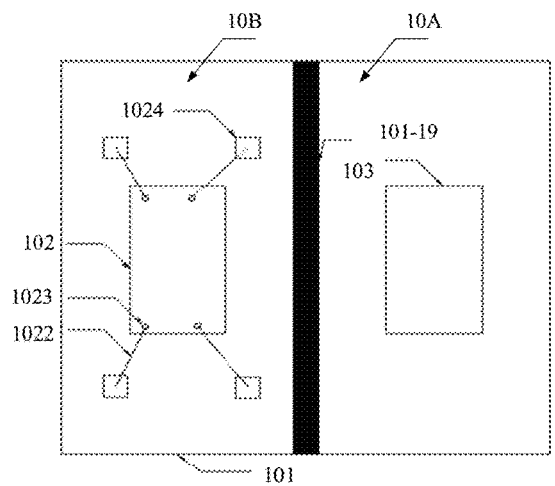
FIG. 3 is a top view of the circuit board shown in FIG. 2.

FIG. 1 is a sectional view of a semiconductor encapsulation structure according to an embodiment of the present disclosure. FIG. 2 is a sectional view of a circuit board according to an embodiment of the present disclosure. FIG. 3 shows a top view of the circuit board in FIG. 2.

It is to be noted that the top view of the circuit board shown in FIG. 3 does not include a thin film encapsulation layer 104 and film layers on one side of the thin film encapsulation layer 104 facing away from a circuit board 101.

Referring to FIGS. 1, 2 and 3, the semiconductor encapsulation structure includes: a circuit board 101, a non-shield module 102, a shield module 103, a thin film encapsulation layer 104 and an electromagnetic shield structure 20. The circuit board 101 includes at least one electromagnetic shield area 10A and a non-electromagnetic shield area 10B located on one side of the electromagnetic shield area 10A. The circuit board 101 internally includes a number N of metal line layers stacked in sequence and insulating layers located between adjacent metal line layers. The number N of metal line layers are electrically connected through conductive vias 101-18 on the insulating layers. A first pad 1024 located within the non-electromagnetic shield area 10B on a first surface 101A of the circuit board 101, a second pad 1025 located within the electromagnetic shield area 10A on the first surface 101A of the circuit board 101, and a power supply ground line 101-19 located on the first surface 101A of the circuit board 101 are electrically connected to the metal line layers through the conductive vias 101-18. The metal line layers includes an antenna structure, and a power supply ground line-signal line hybrid distribution line layer, and N is an integer greater or equal to 1. The non-shield module 102 and the shield module 103 are respectively located on the first surface 101A of the circuit board 101. The non-shield module 102 is located in the non-electromagnetic shield area 10B, and the shield module 103 is located in the electromagnetic shield area 10A. A connection end 1023 of the non-shield module 102 is electrically connected to the first pad 1024 through a conductive wire 1022, and a connection end (not shown in FIG. 1) of the shield module 103 is located on a surface of the second pad 1025 facing away from the circuit board 101, and is electrically connected to the second pad 1025. The thin film encapsulation layer 104 is located on a first surface 101A of the circuit board 101, and the thin film encapsulation layer 104 covers the non-electromagnetic shield area 10B and the electromagnetic shield area 10A. The electromagnetic shield structure 20 forms a closed space with the circuit board 101, and covers the electromagnetic shield area 10A.

Figure 4:
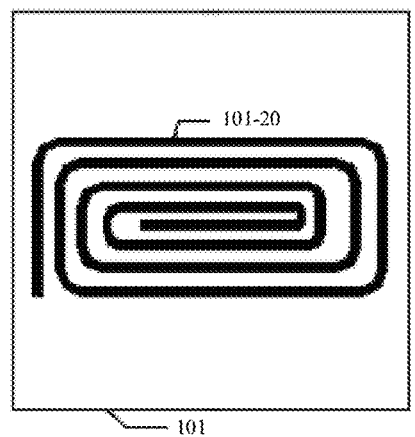
FIG. 4 is a structural view of an antenna structure provided by an embodiment of the present disclosure.

Exemplarily, referring to FIG. 2, N is equal to 8, and the circuit board 101 includes eight metal line layers stacked in sequence. The circuit board 101 includes a first metal line layer 101-2, a second metal line layer 101-4, a third metal line layer 101-6, a fourth metal line layer 101-8, a fifth metal line layer 101-10, a sixth metal line layer 101-12, a seventh metal line layer 101-14, and an eighth metal line layer 101-16. The insulating layers include a first insulating layer 101-1, a second insulating layer 101-3, a third insulating layer 101-5, a fourth insulating layer 101-7, a fifth insulating layer 101-9, a sixth insulating layer 101-11, a seventh insulating layer 101-13, an eighth insulating layer 101-15, and a ninth insulating layer 101-17. One surface of the first insulating layer 101-1 facing away from the first metal line layer 101-2 serves as the first surface 101A of the circuit board 101. The conductive vias 101-18 implement electrical connection between the metal line layers. FIG. 4 is a structural view of an antenna structure provided by an embodiment of the present disclosure. Referring to FIG. 4, the first metal line layer 101-2 and the eighth metal line layer 101-16 each include an antenna structure 101-20, and a power supply ground line-signal line hybrid distribution line layer (101-2, 101-4, 101-6, 101-8, 101-10, 101-12), and the remaining metal line layers each include a power supply ground line-signal line hybrid distribution line layer, and are electrically connected through the conductive vias 101-18. Exemplarily, the power supply ground line 101-19 located on the first surface 101A of the circuit board 101 is a solid metal layer, and the metal is made of copper material with good conductivity. In addition, the power supply ground line-signal line hybrid distribution line layer and materials filled in the conductive vias 101-18 may also select copper with good conductivity. The insulating layers between the metal line layers may select insulating solder mask material to implement electrical isolation between the metal line layers. It is to be noted that FIG. 4 shows a structural arrangement of an antenna structure 101-20 provided by the first metal line layer 101-2 and the eighth metal line layer 101-16. The antenna structure 101-20 in the embodiment of the present disclosure includes, but is not limited to, the structural arrangement of the antenna structure 101-20 shown in FIG. 4. The meaning of the power supply ground line-signal line hybrid distribution line layer refers to: a line layer electrically connected to the power supply ground line and a line layer electrically connected to the signal line which are distributed on a same layer. The signal line is a signal line within the non-shield module 102 and the shield module 103, and is used for transmitting data signals. The line layer is electrically connected to, through the conductive vias 101-18, the signal line which is arranged within the non-shield module 102 and the shield module 103 and used for transmitting the data signals.

On one hand, the thin film encapsulation layer 104 can be used for protecting the non-shield module 102 and the shield module 103 from being damaged during the encapsulation process, and on the other hand, the thin film encapsulation layer 104 can insulate and isolate the shield module 103 and the electromagnetic shield structure 20. Exemplarily, the thin film encapsulation layer 104 may select an insulating filler, and the filler may be a thermosetting material with a relatively low viscosity.

In an embodiment, the connection end of the shield module 103 is located on the one surface of the second pad facing away from the circuit board 101, and the shield module 103 is electrically connected to the connection end 1023 of the non-shield module 102 through the second pad, the conductive vias 101-18, the metal circuit layers, and the first pad 1024. The electromagnetic shield structure 20 covers the electromagnetic shield area 10A and forms the closed space with the circuit board 101, and the electromagnetic shield structure 20 is used for shielding the interference of electromagnetic signals on the shield module 103. Since the thin film encapsulation layer 104 within the non-electromagnetic shield area 10B where the non-shield module 102 is located is not provided with the electromagnetic shield structure 20, on the basis of not raising the height of the non-electromagnetic shield area 10B where the non-shield module 102 is located, the small-size electromagnetic shield structure 20 reduces the size of the semiconductor encapsulation structure and further improves the integration level of the semiconductor encapsulation structure.

Figure 5:
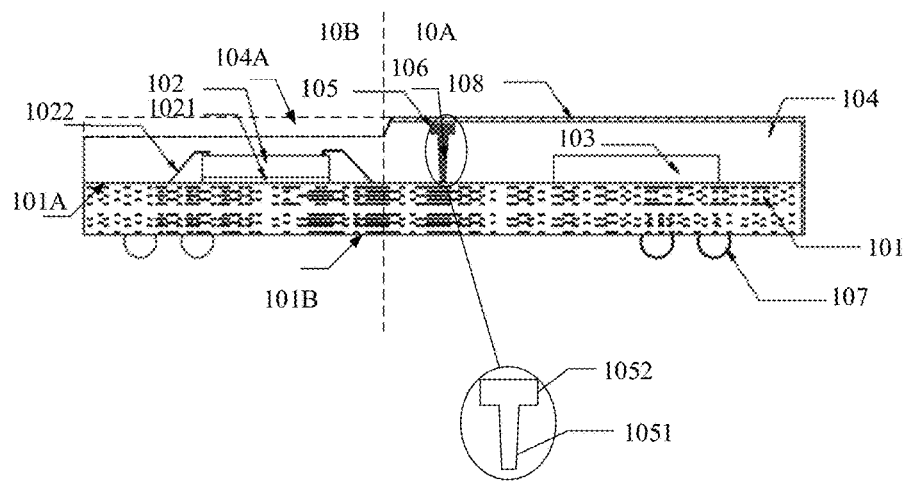
FIG. 5 is a sectional view of another semiconductor encapsulation structure provided by an embodiment of the present disclosure.

FIG. 5 is a sectional view of another semiconductor encapsulation structure according to an embodiment of the present disclosure. In an embodiment, referring to FIG. 5, the one surface of the thin film encapsulation layer 104 facing away from the circuit board 101 is provided with a first groove 104A, and a depth of the first groove 104A is greater than or equal to 100 micrometers and less than or equal to 300 micrometers. The one surface of the thin film encapsulation layer 104 within the non-electromagnetic shield area 10B facing away from the circuit board 101 is provided with the first groove 104A, which reduces the height of the non-electromagnetic shield area 10B where the non-shield module 102 is located, reduces the size of the semiconductor encapsulation structure and further improves the integration level of the semiconductor encapsulation structure.

Figure 6:
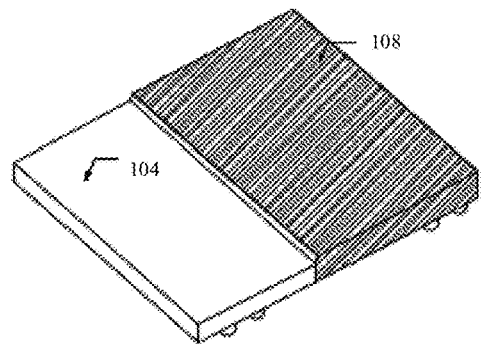
FIG. 6 is an axonometric view of the semiconductor package structure shown in FIG. 5.

FIG. 6 is an axonometric view of FIG. 5. In an embodiment, on the basis of the above solution, referring to FIGS. 5 and 6, the thin film encapsulation layer 104 within the electromagnetic shield area 10A is provided with a second groove 105, the semiconductor encapsulation structure further includes a conductive filling shield wall 106 and an electromagnetic shield sputtered coating 108. The second groove 105 exposes the power supply ground line 101-19 on the first surface 101A of the circuit board 101, and a projection of a bottom of the second groove 105 on the circuit board 101 is located within a projection of the power supply ground line 101-19 on the circuit board 101. The conductive filling shield wall 106 is located in the second groove 105. The electromagnetic shield sputtered coating 108 is located on the surface of the one side, facing away from the circuit board 101, of the thin film encapsulation layer 104 within the electromagnetic shield area 10A, and extends to one side face of the thin film encapsulation layer 104 and one side face of the circuit board 101. The conductive filling shield wall 106 and the electromagnetic shield sputtered coating 108 form the electromagnetic shield structure 20.

In an embodiment, the conductive filling shield wall 106 is electrically connected to the power supply ground line 101-19, and the electromagnetic shield structure 20 is further electrically connected to the power supply ground line 101-19 in the metal line layer. The circuit board 101, the conductive filling shield wall 106 and the electromagnetic shield sputtered coating 108 form a closed space, which may well shield electromagnetic interference signals outside the shield module 103. Compared with the metal cap in the related art, the electromagnetic shield sputtered coating 108 has a greatly reduced thickness and merely covers the one surface of the thin film encapsulation layer 104 within the electromagnetic shield area 10A, which faces away from the circuit board 101. Therefore, horizontal and vertical dimensions of the semiconductor encapsulation structure are greatly reduced. The one surface, facing away from the circuit board 101, of the thin film encapsulation layer 104 within the non-electromagnetic shield area 10B is provided with the first groove 104A, which reduces the height of the non-electromagnetic shield area 10B where the non-shield module 102 is located, reduces the size of the semiconductor encapsulation structure and further improves the integration level of the semiconductor encapsulation structure. In an embodiment, the thickness of the electromagnetic shield sputtered coating 108 is greater than or equal to 2 micrometers and less than or equal to 10 micrometers.

In an embodiment, the second groove 105 exposes the power supply ground line 101-19 on the first surface 101A of the circuit board 101, and the projection of the bottom of the second groove 105 on the circuit board 101 is located within the projection of the power supply ground line 101-19 on the circuit board 101. In an embodiment, referring to FIG. 3, a width of the power supply ground line 101-19 is greater than or equal to 100 micrometers, a length of the power supply ground line 101-19, being exposed out of the second groove 105, of the first surface 101A of the circuit board 101 is less than or equal to 50 micrometers, i.e., a width of the bottom of the second groove 105 is less than or equal to 50 micrometers so as to ensure that one end of the conductive filling shield wall 106 facing towards the circuit board 101 is entirely contacted with and electrically connected to the power supply ground line 101-19.

In an embodiment, on the basis of the above solution, referring to FIG. 5, the non-shield module 102 includes a communication die, and the shield module 103 includes a radio frequency module. The semiconductor encapsulation structure further includes a chip adhesive layer 1021.

The chip adhesive layer 1021 is located on the first surface 101A of the circuit board 101, and the communication die is located on one surface of the chip adhesive layer 1021 facing away from the circuit board 101. In an embodiment, the non-shield module 102 uses the communication die, and the communication die is formed by cutting from a wafer. A height of the communication die is about 200 micrometers, a thickness of the chip adhesive layer 1021 is greater than or equal to 10 micrometers and less than or equal to 30 micrometers, and a diameter of the conductive wire 1022 is greater than or equal to 10 micrometers and less than or equal to 25 micrometers. Compared with the encapsulated communication chip, the size of the communication die in this embodiment is smaller, thereby reducing the size of the non-electromagnetic shield area 10B; an interconnection distance between the non-shield module 102 and the shield module 103 is reduced, which improves the integration level of the semiconductor encapsulation structure; and an electrical signal transmission distance between the non-shield module 102 and the shield module 103 is reduced, so that the signal response speed of the semiconductor encapsulation structure is faster. The communication die controls an antenna structure 101-20 to receive or transmit electromagnetic wave signals. The radio frequency module is used for processing the electromagnetic wave signals, and transmitting electromagnetic waves via the antenna structure through the communication die.

In an embodiment, referring to FIG. 5, in a direction of the thin film encapsulation layer 104 within the electromagnetic shield area 10A facing away from the circuit board 101. The second groove 105 sequentially includes a first sub-groove 1051 with a longitudinal section in an inverted trapezoidal shape and a second sub-groove 1052 with a longitudinal section in a rectangle shape. The first sub-groove 1051 exposes the power supply ground line 101-19 of the first surface 101A of the circuit board 101. The second sub-groove 1052 is communicated with the first sub-groove 1051, a maximum width of the first sub-groove 1051 is less than a width of the second sub-groove 1052, and the first sub-groove 1051 and the second sub-groove 1052 form the second groove 105. In an embodiment, the maximum width of the first sub-groove 1051 is less than the width of the second sub-groove 1052, which facilitates a solder selected by the conductive filling shield wall 106 entering the second sub-groove 1052 and filling the second groove 105. In an embodiment, the width of the second sub-groove 1052 is three to six times of a width (a minimum width) of a bottom of the first sub-groove 1051. In an embodiment, the width of the power supply ground line 101-19 is greater than or equal to 100 micrometers, and a length of the power supply ground line 101-19, being exposed out of the first sub-groove 1051, of the first surface 101A of the circuit board 101 is less than or equal to 50 micrometers, i.e., the width of the bottom of the first sub-groove 1051 is less than or equal to 50 micrometers. In an embodiment, the depth of the first sub-groove 1051 is greater than half of the depth of the entire second groove 105. On the basis of implementing the electrical connection between the conductive filling shield wall 106 and the power supply ground line 101-19, a horizontal dimension of the second groove 105 is reduced, which ensures that the semiconductor encapsulation structure has a preset mechanical strength.

In an embodiment, on the basis of the above solution, referring to FIG. 5, the semiconductor encapsulation structure further includes a conductive ball 107. The conductive ball 107 is located on a second surface 101B of the circuit board 101 opposite to the first surface 101A, and is electrically connected to the metal line layers through the conductive vias 101-18.

In an embodiment, the conductive ball 107 is a conductive tin ball. In an embodiment, a height of the conductive ball 107 is greater than or equal to 250 micrometers, and less than or equal to 500 micrometers. The arrangement of the conductive ball 107 provides an interconnection interface, and the interconnection interface enables the semiconductor encapsulation structure to perform, on the second surface 101B of the circuit board 101, electrically connection to other devices. It is to be noted that when the conductive ball 107 is electrically connected to other devices, the conductive ball 107 needs to be heated and melted, and then the conductive ball 107 is welded together with other devices.

Figure 7:
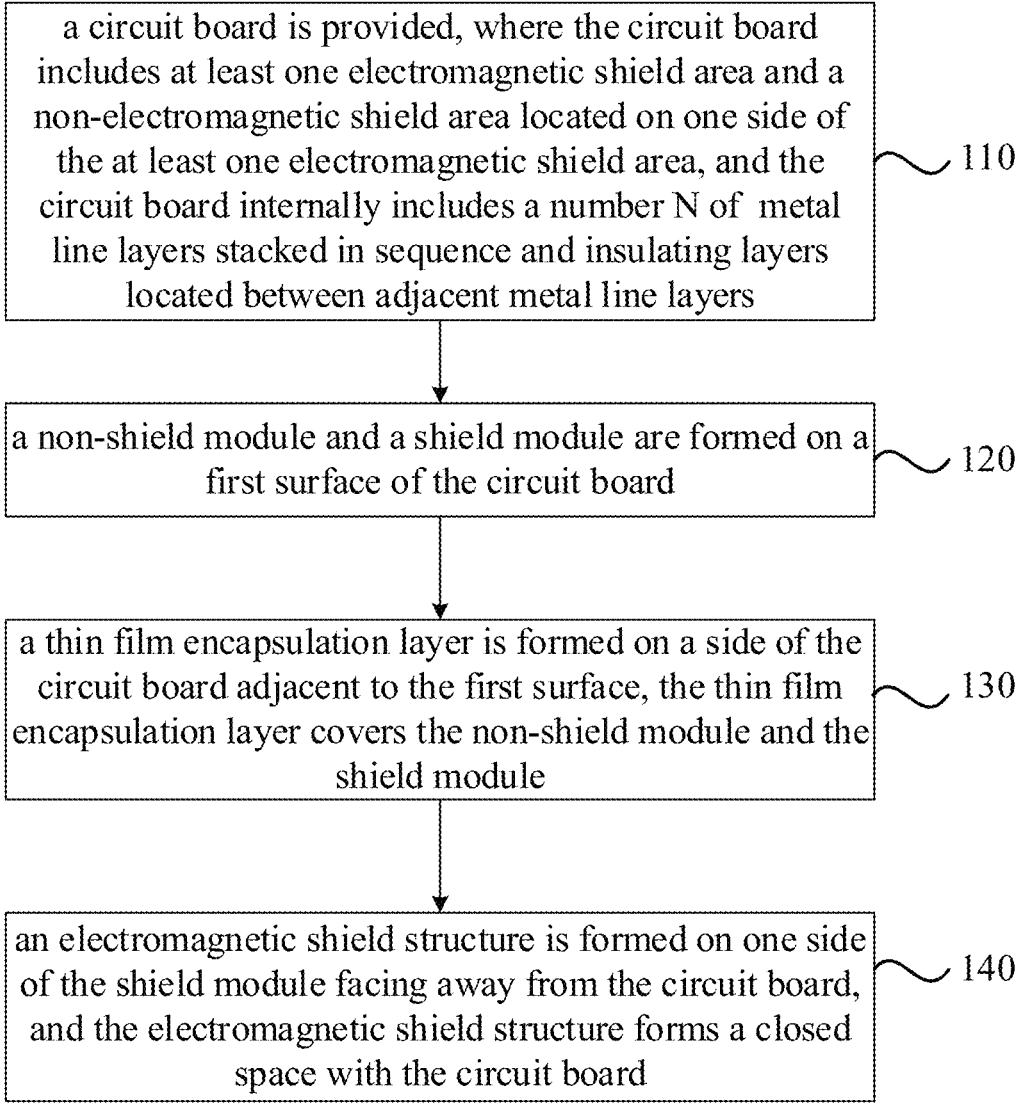
FIG. 7 is a flowchart of an encapsulation method for a semiconductor structure according to an embodiment of the present disclosure.

An embodiment of the present disclosure also provides an encapsulation method for a semiconductor structure. FIG. 7 is a flowchart of an encapsulation method for a semiconductor structure according to an embodiment of the present disclosure. Referring to FIG. 7, the encapsulation method includes steps described below.

In step 110, a circuit board is provided. The circuit board includes at least one electromagnetic shield area and a non-electromagnetic shield area located on one side of the electromagnetic shield area. The circuit board internally includes a number N of metal line layers stacked in sequence, and insulating layers located between adjacent metal line layers. The number N of metal line layers are electrically connected through conductive vias on the insulating layers. A first pad located within the non-electromagnetic shield area of a first surface of the circuit board, a second pad located within the electromagnetic shield area, and a power supply ground line on the first surface of the circuit board are electrically connected to the metal line layers through the conductive vias. The metal line layers includes an antenna structure, and a power supply ground line-signal line hybrid distribution line layer, and N is an integer greater or equal to 1.

Figure 8:
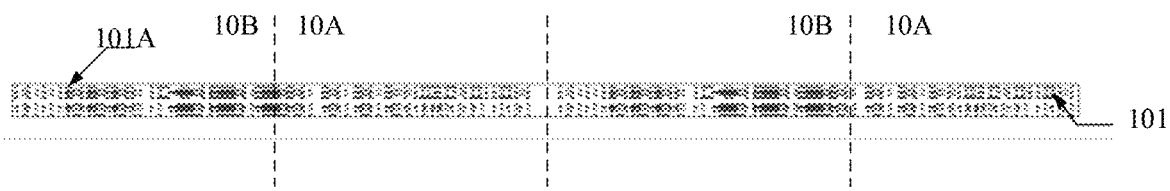
FIGS. 8 to 12 are structural views corresponding to each step of an encapsulation method for a semiconductor structure according to an embodiment of the present disclosure.
Figure 9:
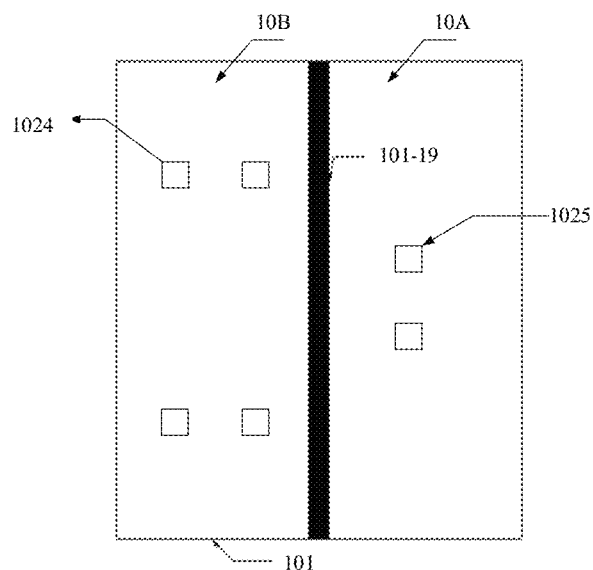

It is to be noted that FIG. 2 is a sectional view of a circuit board provided by an embodiment of the present disclosure. FIG. 9 is a top view of a circuit board provided by an embodiment of the present disclosure. Referring to FIGS. 2, 8 and 9, the circuit board 101 is provided. The circuit board 101 includes at least one electromagnetic shield area 10A and a non-electromagnetic shield area 10B located on one side of the electromagnetic shield area 10A. The circuit board 101 internally includes a number N of metal line layers stacked in sequence, and insulating layers located between adjacent metal line layers. The number N of metal line layers are electrically connected through conductive vias 101-18 on the insulating layers. A first pad 1024 located within the non-electromagnetic shield area 10B of a first surface 101A of the circuit board 101, a second pad 1025 located within the electromagnetic shield area 10A, and a power supply ground line 101-19 on the first surface 101A of the circuit board 101 are electrically connected to the metal line layers through the conductive vias 101-18. The metal line layer includes an antenna structure and a power supply ground line-signal line hybrid distribution line layer, and N is an integer greater or equal to 1.

Exemplarily, referring to FIG. 2, N is equal to 8, and the circuit board 101 includes 8 metal line layers stacked in sequence. One surface of the first insulating layer 101-1 facing away from the first metal line layer 101-2 serves as the first surface 101A of the circuit board 101. The conductive vias 101-18 implement electrical connection between the metal line layers. Referring to FIG. 4, the first metal line layer 101-2 and the eighth metal line layer 101-16 each include an antenna structure 101-20 and a power supply ground line-signal line hybrid distribution line layer (not shown), and the remaining metal line layers each include the power supply ground line-signal line hybrid distribution line layer, and are electrically connected through the conductive vias 101-18. Exemplarily, the power supply ground line 101-19 located on the first surface 101A of the circuit board 101 is a solid metal layer, and the metal is made of copper material with good conductivity. In addition, the power supply ground line-signal line hybrid distribution line layer and materials filled in the conductive vias 101-18 may also select copper with good conductivity. The insulating layers between the metal line layers may select insulating solder mask materials to implement electrical isolation between the metal line layers.

It is to be noted that FIG. 4 shows a structural arrangement of an antenna structure 101-20 provided by the first metal line layer 101-2 and the eighth metal line layer 101-16. The antenna structure 101-20 in the embodiment of the present disclosure includes, but is not limited to, the structural arrangement of the antenna structure 101-20 shown in FIG. 4. The meaning of the power supply ground line-signal line hybrid distribution line layer refers to: a line layer electrically connected to the power supply ground line and a line layer electrically connected to the signal line which are distributed on a same layer.

In step 120, a non-shield module and a shield module are formed on the first surface of the circuit board. The non-shield module is located within the non-electromagnetic shield area, and the shield module is located within the electromagnetic shield area. A connection end of the non-shield module is electrically connected to the first pad through a conductive wire, and a connection end of the shield module is located on one surface of the second pad facing away from the circuit board and is electrically connected to the second pad.

Figure 10:
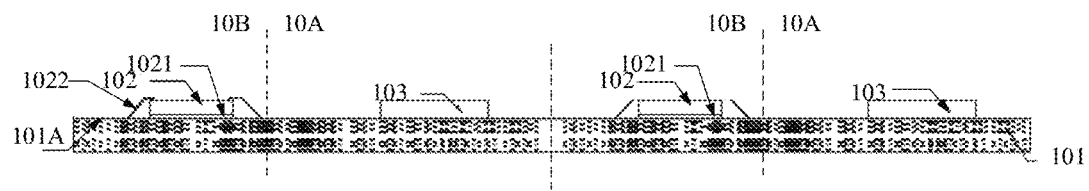

Referring to FIGS. 10 and 3, a non-shield module 102 and a shield module 103 are formed on the first surface 101A of the circuit board 101. The non-shield module 102 is located within the non-electromagnetic shield area 10B, and the shield module 103 is located within the electromagnetic shield area 10A. A connection end 1023 of the non-shield module 102 is electrically connected to the first pad 1024 through a conductive wire 1022, and a connection end of the shield module 103 is located on one surface of the second pad facing away from the circuit board 101 and is electrically connected to the second pad.

In an embodiment, referring to FIG. 10, the step in which the non-shield module and the shield module are formed on the first surface of the circuit board 101 includes the following: a chip adhesive layer 1021 is formed on the first surface 101A of the circuit board 101; a communication die is formed on one side of the chip adhesive layer 1021 facing away from the circuit board 101, and the communication die serves as the non-shield module 102; the shield module 103 is formed on the first surface 101A of the circuit board 101 through a flip-chip bonding process or a surface mount process, and the shield module 103 includes a radio frequency module. The radio frequency module may exemplarily include a radio frequency chip.

In one embodiment, the non-shield module 102 uses the communication die, and the communication die is formed by cutting from a wafer. Compared with an encapsulated communication chip, the communication die in this embodiment is smaller in size, thereby reducing the non-electromagnetic shield area 10B; an interconnection distance between the non-shield module 102 and the shield module 103 is reduced, which improves the integration level of the semiconductor encapsulation structure; and an electrical signal transmission distance between the non-shield module 102 and the shield module 103 is reduced, so that the signal response speed of the semiconductor encapsulation structure is faster. The communication die controls the antenna structure 101-20 to receive or transmit electromagnetic wave signals. The radio frequency module is used for processing the electromagnetic wave signals, and transmitting electromagnetic waves via the antenna structure through the communication die.

In step 130, a thin film encapsulation layer is formed on a side of the circuit board adjacent to the first surface, and the thin film encapsulation layer covers the non-electromagnetic shield area and the electromagnetic shield area.

Figure 11:
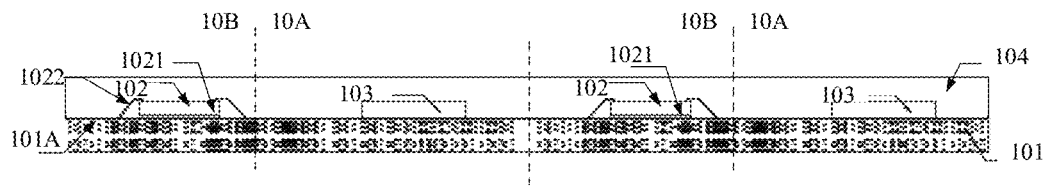

Referring to FIG. 11, a thin film encapsulation layer 104 is formed on a first surface 101A side of the circuit board 101, and the thin film encapsulation layer 104 covers the non-electromagnetic shield area 10B and the electromagnetic shield area 10A. It is to be noted that an entire surface of the thin film encapsulation layer 104 covering the non-electromagnetic shield area 10B and the electromagnetic shield area 10A may be formed through a curing process after thermal injection molding of the entire surface.

In step 140, an electromagnetic shield structure is formed on one side of the shield module facing away from the circuit board, and the electromagnetic shield structure forms a closed space with the circuit board.

Taking FIG. 5 as an example for illustration, the electromagnetic shield structure 20 is formed on one side of the shield module 103 facing away from the circuit board 101, and the electromagnetic shield structure 20 forms a closed space with the circuit board 101.

In one embodiment, before the electromagnetic shield structure is formed on the one side of the shield module facing away from the circuit board, the step 140 further includes that a first groove is formed on one surface of a thin film encapsulation layer within the non-electromagnetic shield area, which faces away from the circuit board.

Figure 12:
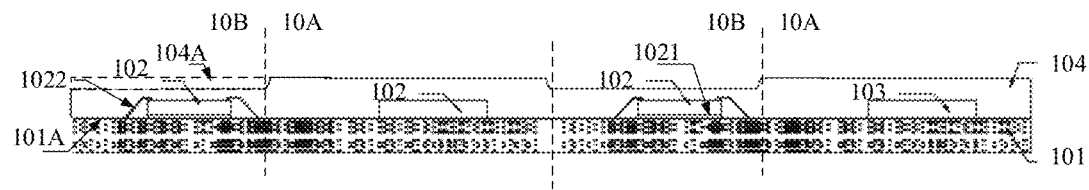

Referring to FIG. 12, the first groove 104A is formed on the one surface of the thin film encapsulation layer 104 within the non-electromagnetic shield area 10B, which faces away from the circuit board 101. The first groove 104A is formed within the non-electromagnetic shield area 10B that does not need to shield electromagnetic signals, thereby reducing the height of the non-electromagnetic shield area 10B where the non-shield module 102 is located, reducing the size of the semiconductor encapsulation structure, and further improving the integration level of the semiconductor encapsulation structure.

In the solution provided by this embodiment, the connection end of the shield module 103 is located on the one surface of the second pad facing away from the circuit board 101, and the shield module 103 is electrically connected to the connection end 1023 of the non-shield module 102 through the second pad, the conductive vias 101-18, the metal line layers and the first pad 1024. The electromagnetic shield structure 20 covers the electromagnetic shield area 10A, forms the closed space with the circuit board 101, and is used for shielding the interference of electromagnetic signals on the shield module 103. Since the thin film encapsulation layer 104 within the non-electromagnetic shield area 10B where the non-shield module 102 is located is not provided with an electromagnetic shield structure 20, on the basis of not raising the height of the non-electromagnetic shield area 10B where the non-shield module 102 is located, the small-size electromagnetic shield structure 20 reduces the size of the semiconductor encapsulation structure and further improves the integration level of the semiconductor encapsulation structure.

FIG. 13 is a flowchart of another encapsulation method for a semiconductor structure according to an embodiment of the present disclosure. In an embodiment, on the basis of the above solution, referring to FIG. 13, the step 140 in which the electromagnetic shield structure is formed on the one side of the shield module facing away from the circuit board includes the following.

In step 1401, a second groove is formed on the thin film encapsulation layer within the electromagnetic shield area, a power supply ground line on the first surface of the circuit board is exposed out of the second groove, and a projection of a bottom of the second groove on the circuit board is located within a projection of the power supply ground line on the circuit board.

Figure 14:
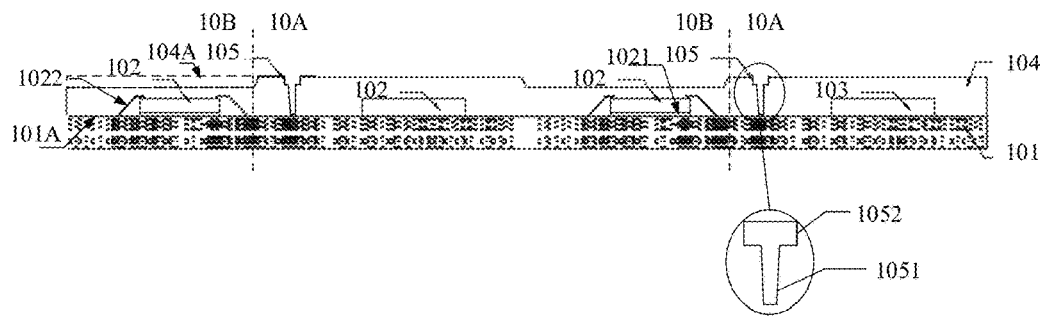
FIGS. 14 to 20 are structural views corresponding to each step of an encapsulation method for a semiconductor structure according to an embodiment of the present disclosure.

Referring to FIG. 14, the second groove 105 is formed on the thin film encapsulation layer 104 within the electromagnetic shield area 10A, the power supply ground line 101-19 on the first surface 101 of the circuit board 101 is exposed out of the second groove 105, and the projection of the bottom of the second groove 105 on the circuit board 101 is located within the projection of the power supply ground line 101-19 on the circuit board 101.

In an embodiment, referring to FIG. 14, the step in which the second groove 105 is formed on the thin film encapsulation layer 104 within the electromagnetic shield area 10A and the power supply ground line 101-19 on the first surface 101A of the circuit board 101 is exposed out of the second groove 105 includes the following: in a direction of the thin film encapsulation layer 104 within the electromagnetic shield area 10A facing away from the circuit board 101, a first sub-groove 1051 with a longitudinal section in an inverted trapezoidal shape and a second sub-groove 1052 with the longitudinal section in a rectangle shape are formed in sequence, the first sub-groove 1051 exposes the power supply ground line 101-19 on the first surface 101A of the circuit board 101. The second sub-groove 1052 is communicated with the first sub-groove 1051, and a maximum width of the first sub-groove 1051 is less than a width of the second sub-groove 1052, and the first sub-groove 1051 and the second sub-groove 1052 form the second groove 105.

In step 1402, a sacrificial layer is formed in the first groove, where a height of the sacrificial layer is equal to a depth of the first groove.

Figure 15:
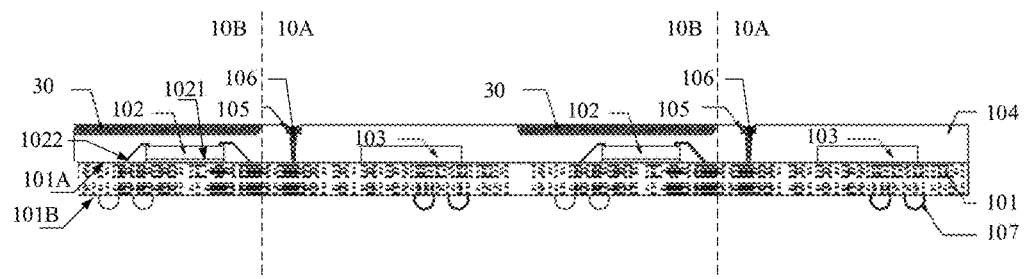

Referring to FIG. 15, the sacrificial layer 30 is formed in the first groove 104A, where the height of the sacrificial layer 30 is equal to the depth of the first groove 104A. Exemplarily, the sacrificial layer 30 may be colloid.

In step 1403, the conductive filling shield wall is formed in the second groove.

Figure 16:
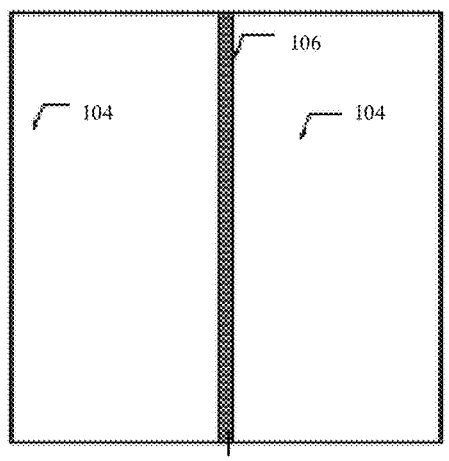

Referring to FIGS. 15 and 16, the conductive filling shield wall 106 is formed in the second groove 105. It is to be noted that in FIG. 16, the second groove 105 is formed in the thin film encapsulation layer 104 within the electromagnetic shield area 10A and exposes the power supply ground line 101-19 on the first surface 101A of the circuit board 101, and the conductive filling shield wall 106 is located in the second groove 105, thus the conductive filling shield wall 106 covers the power supply ground line 101-19. It is to be noted that FIG. 16 merely shows a structure of one power supply ground line 101-19.

In step 1404, the thin film encapsulation layer and the circuit board are cut along a cutting street, so as to form a single semiconductor encapsulation structure, where each semiconductor encapsulation structure includes at least one shield module and at least one non-shield module.

Figure 17:
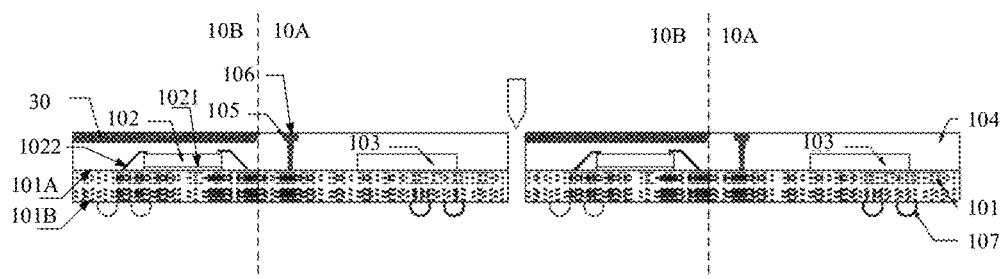

Referring to FIG. 17, the thin film encapsulation layer 104 and the circuit board 101 are cut along the cutting street, the single semiconductor encapsulation structure is formed, where each of the semiconductor encapsulation structure includes at least one shield module 103 and at least one non-shield module 102.

By cutting the thin film encapsulation layer 104 and the circuit board 101 along the cutting street, the single semiconductor encapsulation structure is formed, which improves production efficiency compared to encapsulating the single semiconductor encapsulation structure.

In an embodiment, before the step in which the thin film encapsulation layer and the circuit board are cut along the cutting street so as to form the single semiconductor encapsulation structure, a conductive ball 107 is formed on a second surface of the circuit board opposite to the first surface through a ball mounting process, where the conductive ball is electrically connected to the metal line layers through the conductive vias.

Figure 18:
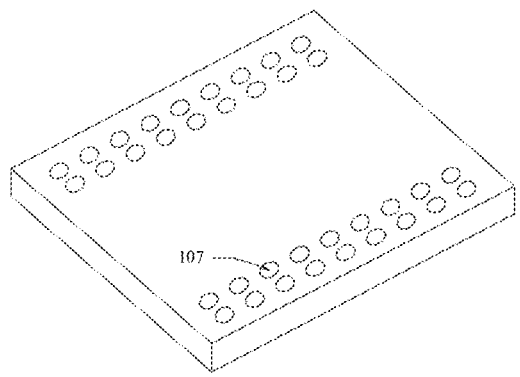

Referring to FIGS. 15, 17 and 18, the conductive ball 107 is formed on the second surface 101B of the circuit board 101 opposite to the first surface 101A through the ball mounting process, where the conductive ball is electrically connected to the metal line layers through the conductive vias.

Exemplarily, the conductive ball 107 is a conductive tin ball. In an embodiment, the height of the conductive ball 107 is greater than or equal to 250 micrometers, and less than or equal to 500 micrometers. The arrangement of the conductive ball 107 provides an interconnection interface, and the interconnection interface enables the semiconductor encapsulation structure to perform, on the second surface 101B of the circuit board 101, electrically connection to other devices. It is to be noted that when the conductive ball 107 is electrically connected to other devices, the conductive ball 107 needs to be heated and melted, and then the conductive ball 107 is welded together with other devices.

In step 1405, an electromagnetic shield sputtered coating is formed on one surface of the thin film encapsulation layer, which faces away from the circuit board, one side face of the thin film encapsulation layer, and one side face of the circuit board, and.

Figure 19:
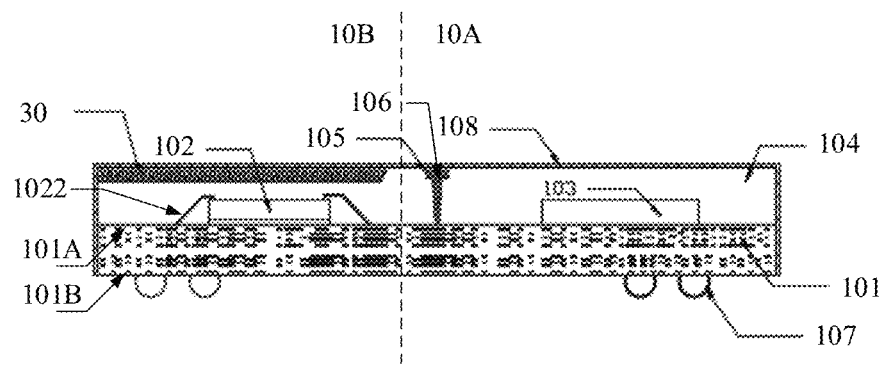

Referring to FIG. 19, the electromagnetic shield sputtered coating 108 is formed on one side face of the circuit board 101, one side face of the thin film encapsulation layer 104 and one surface of the thin film encapsulation layer 104 facing away from the circuit board 101.

In an embodiment, the conductive filling shield wall 106 is electrically connected to the power supply ground line 101-19, and the electromagnetic shield sputtered coating 108 constitutes the electromagnetic shield structure 20 to be electrically connected to the power supply ground line 101-19 in the metal line layers. In addition, the circuit board 101, the conductive filling shield wall 106 and the electromagnetic shield sputtered coating 108 constitute a closed space, which may well shield electromagnetic interference signals outside the shield module 103.

In an embodiment, the thickness of the electromagnetic shield sputtered coating 108 is greater than or equal to 2 micrometers, and less than or equal to 10 micrometers.

In an embodiment, the second groove 105 exposes the supply ground line 101-19 on the first surface 101A of the circuit board 101, and the projection of the bottom of the second groove 105 on the circuit board 101 is located within the projection of the power supply ground line 101-19 on the circuit board 101. Exemplarily, referring to FIG. 3, a width of the power supply ground line 101-19 is greater than or equal to 100 micrometers, and a length of the power supply ground line 101-19, being exposed out of the the second groove 105, on the first surface 101A of the circuit board 101 is less than or equal to 50 micrometers, i.e., a width of the bottom of the second groove 105 is less than or equal to 50 micrometers so as to ensure that one end of the conductive filling shield wall 106 facing towards the circuit board 101 is entirely contacted with and electrically connected to the power supply ground line 101-19.

In step 1406, the electromagnetic shield sputtered coating and the sacrificial layer within the non-electromagnetic shield area are removed.

Figure 20:
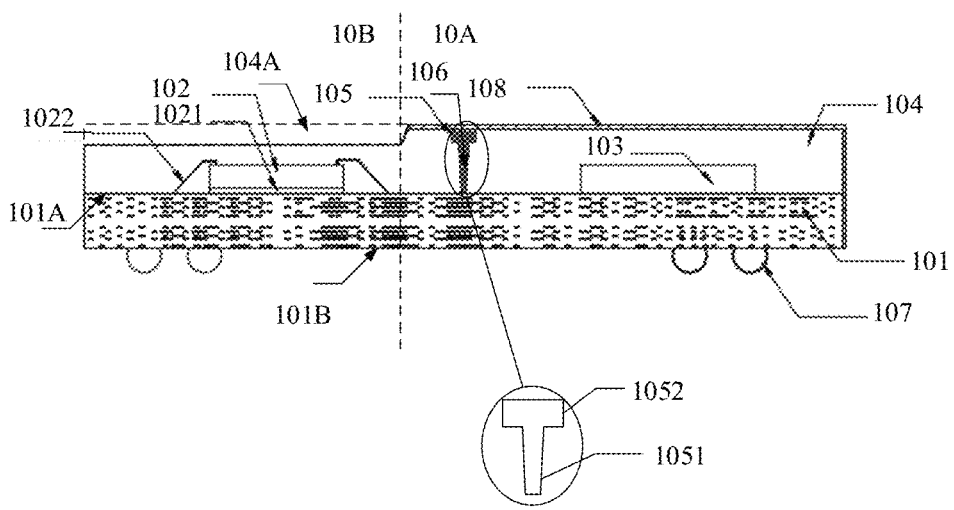

Referring to FIG. 20, the electromagnetic shield sputtered coating 108 and the sacrificial layer 30 within the non-electromagnetic shield area 10B are removed. Arrangement of the sacrificial layer 30 reduces the difficulty of removing the electromagnetic shield sputtered coating 108 within the non-electromagnetic shield area 10B.

In an embodiment, the maximum width of the first sub-groove 1051 is less than the width of the second sub-groove 1052, which facilitates solders selected by the conductive filling shield wall 106 entering the second sub-groove 1052 and filling the second groove 105. Exemplarily, the width of the power supply ground line 101-19 is greater than or equal to 100 micrometers, and a length of the power supply ground line 101-19, being exposed out of the first sub-groove 1051, on the first surface 101A of the circuit board 101 is less than or equal to 50 micrometers, i.e., the width of the bottom of the first sub-groove 1051 is less than or equal to 50 micrometers. In an embodiment, the depth of the first sub-groove 1051 is greater than half of the depth of the entire second groove 105. On the basis of implementing the electrical connection between the conductive filling shield wall 106 and the power supply ground line 101-19, reducing a horizontal dimension of the second groove 105 ensures that the semiconductor encapsulation structure has a preset mechanical strength.

Compared with the metal cap in the existing art, the thickness of the electromagnetic shield sputtered coating 108 is greatly reduced, and the electromagnetic shield sputtered coating 108 merely covers the surface of the one side, facing away from the circuit board 101, of the thin film encapsulation layer 104 within the electromagnetic shield area 10A. Therefore, horizontal and vertical dimensions of the semiconductor encapsulation structure are greatly reduced. The one surface, facing away from the circuit board 101, of the thin film encapsulation layer 104 within the non-electromagnetic shield area 10B is provided with the first groove 104A, which reduces the height of the non-electromagnetic shield area 10B where the non-shield module 102 is located, reduces the size of the semiconductor encapsulation structure and further improves the integration level of the semiconductor encapsulation structure.

It is to be noted that the above are merely preferred embodiments of the present disclosure and the technical principles used therein. It is to be understood by those skilled in the art that the present disclosure is not limited to the embodiments described herein. Those skilled in the art can make various apparent modifications, adaptations and substitutions without departing from the scope of the present disclosure. Therefore, while the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A semiconductor encapsulation structure, comprising:
   a circuit board, which comprises at least one electromagnetic shield area and a non-electromagnetic shield area located on one side of the at least one electromagnetic shield area, wherein the circuit board internally comprises a number N of metal line layers stacked in sequence and insulating layers located between adjacent metal line layers, the number N of metal line layers are electrically connected through conductive vias on the insulating layers, a first pad located within the non-electromagnetic shield area on a first surface of the circuit board, a second pad located within the at least one electromagnetic shield area on the first surface of the circuit board, and a power supply ground line on the first surface of the circuit board are electrically connected to the number N of metal line layers, wherein the number N of metal line layers comprise an antenna structure and a power supply ground line-signal line hybrid distribution line layer, and N is an integer greater or equal to 1;
   a non-shield module and a shield module, which are respectively located on the first surface of the circuit board, wherein the non-shield module is located within the non-electromagnetic shield area, the shield module is located within the at least one electromagnetic shield area, a connection end of the non-shield module is electrically connected to the first pad through a conductive wire, and a connection end of the shield module is located on one surface of the second pad facing away from the circuit board and is electrically connected to the second pad;
   a thin film encapsulation layer, located on a side of the circuit board adjacent to the first surface, wherein the thin film encapsulation layer covers the non-electromagnetic shield area and the at least one electromagnetic shield area; and
   an electromagnetic shield structure, covering the at least one electromagnetic shield area and forming a closed space with the circuit board;
   wherein one surface of the thin film encapsulation layer within the non-electromagnetic shield area, which faces away from the circuit board, is provided with a first groove.

2. The semiconductor encapsulation structure of claim 1, further comprising a conductive filling shield wall and an electromagnetic shield sputtered coating, wherein the thin film encapsulation layer within the at least one electromagnetic shield area is provided with a second groove;
   the second groove is configured to expose the power supply ground line on the first surface of the circuit board, and a projection of a bottom of the second groove on the circuit board is located within a projection of the power supply ground line on the first surface on the circuit board;
   the conductive filling shield wall is located in the second groove; and
   the electromagnetic shield sputtered coating is located on the one surface of the thin film encapsulation layer within the at least one electromagnetic shield area, which faces away from the circuit board; and the electromagnetic shield sputtered coating extends to one side face of the thin film encapsulation layer and one side face of the circuit board.

3. The semiconductor encapsulation structure of claim 2, wherein a thickness of the electromagnetic shield sputtered coating is greater than or equal to 2 micrometers and less than or equal to 10 micrometers.

4. The semiconductor encapsulation structure of claim 2, wherein a width of the power supply ground line is greater than or equal to 100 micrometers, a length of the power supply ground line, being exposed out of the second groove, of the first surface of the circuit board is less than or equal to 50 micrometers.

5. The semiconductor encapsulation structure of claim 2, wherein in a direction of the thin film encapsulation layer within the at least one electromagnetic shield area facing away from the circuit board, the second groove sequentially comprises a first sub-groove with a longitudinal section in an inverted trapezoidal shape and a second sub-groove with a longitudinal section in a rectangle shape, the first sub-groove is configured to expose the power supply ground line on the first surface of the circuit board, wherein the second sub-groove is communicated with the first sub-groove, and a maximum width of the first sub-groove is less than a width of the second sub-groove, and the first sub-groove and the second sub-groove form the second groove.

6. The semiconductor encapsulation structure of claim 5, wherein a depth of the first sub-groove is greater than half of a depth of the entire second groove.

7. The semiconductor encapsulation structure of claim 1, wherein a depth of the first groove is greater than or equal to 100 micrometers and less than or equal to 300 micrometers.

8. The semiconductor encapsulation structure of claim 1, further comprising a chip adhesive layer, wherein the non-shield module comprises a communication die, and the shield module comprises a radio frequency module;
the chip adhesive layer is located on the first surface of the circuit board; and
the communication die is located on one surface of the chip adhesive layer facing away from the circuit board.

9. The semiconductor encapsulation structure of claim 8, wherein a thickness of the chip adhesive layer is greater than or equal to 10 micrometers and less than or equal to 30 micrometers, and a diameter of the conductive wire is greater than or equal to 10 micrometers and less than or equal to 25 micrometers.

10. The semiconductor encapsulation structure of claim 1, further comprising a conductive ball, wherein the conductive ball is located on a second surface of the circuit board opposite to the first surface, and is electrically connected to the number N of metal line layers through the conductive vias.

11. An encapsulation method for a semiconductor structure, comprising:
providing a circuit board, wherein the circuit board comprises at least one electromagnetic shield area and a non-electromagnetic shield area located on one side of the at least one electromagnetic shield area, wherein the circuit board internally comprises a number N of metal line layers stacked in sequence and insulating layers located between adjacent metal line layers, the number N of metal line layers are electrically connected through conductive vias on the insulating layers, a first pad located within the non-electromagnetic shield area on a first surface of the circuit board, a second pad located within the at least one electromagnetic shield area on the first surface of the circuit board, and a power supply ground line on the first surface of the circuit board are electrically connected to the number N of metal line layers, wherein the number N of metal line layers comprise an antenna structure and a power supply ground line-signal line hybrid distribution line layer, and N is an integer greater or equal to 1;
forming a non-shield module and a shield module on the first surface of the circuit board, wherein the non-shield module is located within the non-electromagnetic shield area, the shield module is located within the at least one electromagnetic shield area, a connection end of the non-shield module is electrically connected to the first pad through a conductive wire, a connection end of the shield module is located on one surface of the second pad facing away from the circuit board and is electrically connected to the second pad;
forming a thin film encapsulation layer on a side of the circuit board adjacent to the first surface, wherein the thin film encapsulation layer covers the non-electromagnetic shield area and the at least one electromagnetic shield area;
forming an electromagnetic shield structure on one side of the shield module facing away from the circuit board, and forming a closed space by the electromagnetic shield structure and the circuit board; and
before the forming the electromagnetic shield structure on the one side of the shield module facing away from the circuit board, the method further comprising:
forming a first groove on one surface of the thin film encapsulation layer within the non-electromagnetic shield area, wherein the one surface of the thin film encapsulation layer within the non-electromagnetic shield area faces away from the circuit board.

12. The encapsulation method for the semiconductor structure of claim 11, wherein the forming the electromagnetic shield structure on the one side of the shield module facing away from the circuit board comprises:
forming a second groove on the thin film encapsulation layer within the at least one electromagnetic shield area and exposing the power supply ground line on the first surface of the circuit board, wherein a projection of a bottom of the second groove on the circuit board is located within a projection of the power supply ground line on the first surface on the circuit board;
forming a sacrificial layer in the first groove, wherein a height of the sacrificial layer is equal to a depth of the first groove;
forming a conductive filling shield wall in the second groove;
cutting the thin film encapsulation layer and the circuit board along a cutting street, and forming a single semiconductor encapsulation structure, wherein each semiconductor encapsulation structure comprises at least one shield module and at least one non-shield module;
forming an electromagnetic shield sputtered coating on one surface of the thin film encapsulation layer facing away from the circuit board, one side face of the thin film encapsulation layer and one side face of the circuit board; and
removing the electromagnetic shield sputtered coating and the sacrificial layer within the non-electromagnetic shield area.

13. The encapsulation method for the semiconductor structure of claim 12, wherein the forming the second groove on the thin film encapsulation layer within the at least one electromagnetic shield area and exposing the power supply ground line on the first surface of the circuit board comprises: in a direction of the thin film encapsulation layer within the at least one electromagnetic shield area facing away from the circuit board, sequentially forming a first sub-groove with a longitudinal section in an inverted trapezoidal shape and a second sub-groove with a longitudinal section in a rectangle shape, wherein the first sub-groove is configured to expose the power supply ground line on the first surface of the circuit board, wherein the second sub-groove is communicated with the first sub-groove, and a maximum width of the first sub-groove is less than a width of the second sub-groove, and the first sub-groove and the second sub-groove form the second groove.

14. The encapsulation method for the semiconductor structure of claim 13, wherein a depth of the first sub-groove is greater than half of a depth of the entire second groove.

15. The encapsulation method for the semiconductor structure of claim 12, wherein before the cutting the thin film encapsulation layer and the circuit board along the cutting street and forming the single semiconductor encapsulation structure, the method comprises: forming a conductive ball on a second surface of the circuit board opposite to the first surface through a ball mounting process, wherein the conductive ball is electrically connected to the number N of metal line layers through the conductive vias.

16. The encapsulation method for the semiconductor structure of claim 12, wherein a thickness of the electromagnetic shield sputtered coating is greater than or equal to 2 micrometers and less than or equal to 10 micrometers.

17. The encapsulation method for the semiconductor structure of claim 12, wherein a width of the power supply ground line is greater than or equal to 100 micrometers, a length of the power supply ground line, being exposed out of the second groove, of the first surface of the circuit board is less than or equal to 50 micrometers.

18. The encapsulation method for the semiconductor structure of claim 11, wherein the forming the non-shield module and the shield module on the first surface of the circuit board comprises:
    forming a chip adhesive layer on the first surface of the circuit board;
    forming a communication die on one side of the chip adhesive layer facing away from the circuit board; and
    forming the shield module on the first surface of the circuit board through a patch process, wherein the shield module comprises a radio frequency module.

19. The encapsulation method for the semiconductor structure of claim 18, wherein a thickness of the chip adhesive layer is greater than or equal to 10 micrometers and less than or equal to 30 micrometers, and a diameter of the conductive wire is greater than or equal to 10 micrometers and less than or equal to 25 micrometers.

20. The encapsulation method for the semiconductor structure of claim 11, wherein a depth of the first groove is greater than or equal to 100 micrometers and less than or equal to 300 micrometers.

* * * * *